United States Patent
Yang et al.

(10) Patent No.: US 10,181,842 B2
(45) Date of Patent: Jan. 15, 2019

(54) MIXED THRESHOLD FLIP-FLOP ELEMENT TO MITIGATE HOLD TIME PENALTY DUE TO CLOCK DISTORTION

(71) Applicant: NVIDIA CORPORATION, Santa Clara, CA (US)

(72) Inventors: Ge Yang, Dublin, CA (US); Xi Zhang, San Jose, CA (US); Jiani Yu, Sunnyvale, CA (US); Lingfei Deng, San Jose, CA (US); Hwong-Kwo Lin, Palo Alto, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 0 days.

(21) Appl. No.: 14/945,377

(22) Filed: Nov. 18, 2015

(65) Prior Publication Data
US 2017/0141768 A1   May 18, 2017

(51) Int. Cl.
*H03K 3/356* (2006.01)
*H03K 3/037* (2006.01)

(52) U.S. Cl.
CPC . *H03K 3/356104* (2013.01); *H03K 3/356121* (2013.01); *H03K 3/0375* (2013.01)

(58) Field of Classification Search
CPC .................. H03K 3/3562; H03K 3/356104
See application file for complete search history.

(56) References Cited

U.S. PATENT DOCUMENTS

| | | | | |
|---|---|---|---|---|
| 5,982,211 A | * | 11/1999 | Ko | H03K 17/693 327/202 |
| 6,304,123 B1 | * | 10/2001 | Bosshart | G11C 7/1051 326/95 |
| 7,248,090 B2 | * | 7/2007 | Ramprasad | H03K 3/356 327/202 |
| 8,856,712 B2 | | 10/2014 | Pancholi et al. | |
| 2014/0139262 A1 | | 5/2014 | Penzes | |

* cited by examiner

*Primary Examiner* — Hai L Nguyen
(74) *Attorney, Agent, or Firm* — Artegis Law Group, LLP (57) ABSTRACT

A flip-flop element is configured to include FinFET technology transistors with a mix of threshold voltage levels. The data input path includes FinFET transistors configured with high voltage thresholds (HVT). The clock input path includes transistors configured with standard voltage thresholds (SVT). By including FinFET transistors with SVT thresholds in the clock signal path, the Miller capacitance of the clock signal path is reduced relative to HVT FinFET transistors, leading to lower rise time and correspondingly lower hold time. By including HVT threshold devices in the data input path, the flip-flop element attains high speed and low power operation. By including SVT threshold devices in the clock signal path, the flip-flop element achieves faster switching times in the clock signal path.

25 Claims, 6 Drawing Sheets

(Prior Art)

Figure 4

(Prior Art)

MIXED THRESHOLD FLIP-FLOP ELEMENT TO MITIGATE HOLD TIME PENALTY DUE TO CLOCK DISTORTION

BACKGROUND OF THE INVENTION

Field of the Invention

Embodiments of the present invention relate generally to integrated circuit design and, more specifically, to a mixed threshold flip-flop element to mitigate hold time penalty due to clock distortion.

Description of the Related Art

In the field of integrated circuit technology, bi-stable multivibrators, commonly referred to as flip-flop elements, are widely deployed to implement various functions. In particular, flip-flop elements deployed in graphics processing units (GPUs) implement functions such as data storage, data transfer, counters, and frequency division. A flip-flop element has two stable states and stores or transfers data by latching the state of the input data and transmitting the latched state to the output.

Flip-flop elements are constructed using transistors, typically field-effect transistors, integrated onto a substrate, such as silicon. A periodic signal, referred to as a clock signal, is applied to one input of the flip-flop element in order to store the state of a second signal, referred to as a data input signal. The latching action of the flip-flop element may occur on the rising edge of the clock, on the falling edge, or in the case of double data rate systems, on both edges. The flip-flop element then presents the stored state of the input signal at the output of the flip-flop element. In order to reliably store the data input, the data input signal is held stable for a minimum amount of time prior to the active edge of the clock signal (the setup time) and a minimum amount of time after the active edge of the clock signal (the hold time). Otherwise, the flip-flop element may not correctly transfer the state of the data input signal. Thus, the integrity of the relationship between the data input and the clock input is critical to proper timing within the system.

A trend toward faster, smaller, more power-efficient computer systems has led to the development of new transistor technologies in order to achieve higher performance and higher circuit density while maintaining low power consumption. Specifically, a critical design criterion is increasing performance per Watt. A key development in this trend is a type of transistor termed a FinFET. A FinFET is a multi-gate three-dimensional field-effect transistor (FET) that offers significant performance improvement and power reduction compared to conventional planar complementary metal-oxide-semiconductor (CMOS) devices. FinFETs have a three-dimensional structure, providing the ability to achieve a higher transistor density per square area relative to planar FETs. Further, the FinFET can operate at a lower voltage for a given leakage current. Because of these advantages, FinFETs are an attractive technology to implement flip-flop elements and provide increased density, performance, and power efficiency.

One drawback of FinFET technology is that the Miller capacitance in a FinFET is typically higher relative to conventional CMOS structures. The Miller effect is the increase in input capacitance of an inverting amplifier, such as an FET, due to the amplification of the capacitance between the input and output terminals. One effect of the increased Miller capacitance caused by the Miller effect is a distortion of a signal at the gate terminal of a FinFET, leading to an increase in the rise time of the gate waveform. This distortion causes an uncertainty in the point at which the input data transfers to the output, of the FinFET. The variation in the actual trip threshold causes a delay in the clock signal. This delay further increases with loading (that is, increased fan-out), lower temperature operation, and lower voltage operation. As a result, the hold time with respect to the data input of a flip-flop element increases in order to accommodate the longer clock signal delay. The increased hold time limits the attainable speed of system processing, leading to reduced system performance.

As the foregoing illustrates, what is needed in the art is a more effective technique to increase performance in flip-flop element design.

SUMMARY OF THE INVENTION

One embodiment of the present invention sets forth a circuit element configured to perform a data capture operation including a first logic element configured to receive a first data signal that has a first logic state, where the first logic element is further configured to change logic state at a first time interval after the first data signal transitions through a first threshold level, and a second logic element configured to receive a first clock signal, where the second logic element is further configured to change logic state at a second time interval after the first clock signal transitions through a second threshold level, and where the second time interval is less than the first time interval.

One advantage of the disclosed approach is that the low power and high speed advantages of FinFET technology are achieved, while hold times are reduced relative to prior approaches.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details.

System Overview

Figure 1:
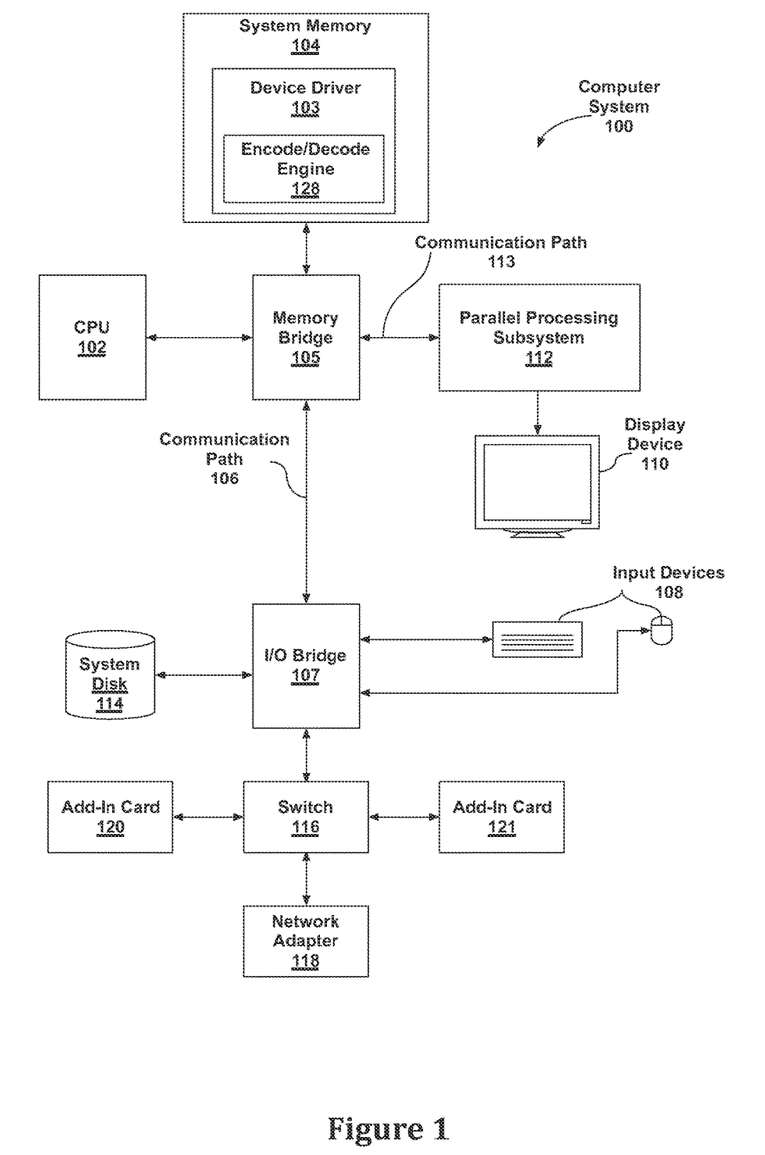
FIG. 1 is a block diagram illustrating a computer system configured to implement one or more aspects of the present invention.

FIG. 1 is a block diagram illustrating a computer system 100 configured to implement one or more aspects of the present invention. As shown, computer system 100 includes, without limitation, a central processing unit (CPU) 102 and a system memory 104 coupled to a parallel processing subsystem 112 via a memory bridge 105 and a communication path 113. Memory bridge 105 is further coupled to an I/O (input/output) bridge 107 via a communication path 106, and I/O bridge 107 is, in turn, coupled to a switch 116.

In operation, I/O bridge 107 is configured to receive user input information from input devices 108, such as a keyboard or a mouse, and forward the input information to CPU 102 for processing via communication path 106 and memory bridge 105. Switch 116 is configured to provide connections between I/O bridge 107 and other components of the computer system 100, such as a network adapter 118 and various add-in cards 120 and 121.

As also shown, I/O bridge 107 is coupled to a system disk 114 that may be configured to store content and applications and data for use by CPU 102 and parallel processing subsystem 112. As a general matter, system disk 114 provides non-volatile storage for applications and data and may include fixed or removable hard disk drives, flash memory devices, and CD-ROM (compact disc read-only-memory), DVD-ROM (digital versatile disc-ROM), Blu-ray, HD-DVD (high definition DVD), or other magnetic, optical, or solid state storage devices. Finally, although not explicitly shown, other components, such as universal serial bus or other port connections, compact disc drives, digital versatile disc drives, film recording devices, and the like, may be connected to I/O bridge 107 as well.

In various embodiments, memory bridge 105 may be a Northbridge chip, and I/O bridge 107 may be a Southbridge chip. In addition, communication paths 106 and 113, as well as other communication paths within computer system 100, may be implemented using any technically suitable protocols, including, without limitation, AGP (Accelerated Graphics Port), HyperTransport, or any other bus or point-to-point communication protocol known in the art.

In some embodiments, parallel processing subsystem 112 comprises a graphics subsystem that delivers pixels to a display device 110 that may be any conventional cathode ray tube, liquid crystal display, light-emitting diode display, or the like. In such embodiments, the parallel processing subsystem 112 incorporates circuitry optimized for graphics and video processing, including, for example, video output circuitry. As described in greater detail below in FIG. 2, such circuitry may be incorporated across one or more parallel processing units (PPUs) included within parallel processing subsystem 112. In other embodiments, the parallel processing subsystem 112 incorporates circuitry optimized for general purpose and/or compute processing. Again, such circuitry may be incorporated across one or more PPUs included within parallel processing subsystem 112 that are configured to perform such general purpose and/or compute operations. In yet other embodiments, the one or more PPUs included within parallel processing subsystem 112 may be configured to perform graphics processing, general purpose processing, and compute processing operations. System memory 104 includes at least one device driver 103 configured to manage the processing operations of the one or more PPUs within parallel processing subsystem 112.

As also shown, device driver 103 includes encode/decode engine 128. In operation, encode/decode engine 128 is configured to perform compression and decompression of data in memory bridge 105 that is sent and received, respectively, via parallel processing subsystem 112. In operation, encode/decode engine 128 typically receives full resolution video data in RGB 4:4:4 format and converts the data to a YUV 4:4:4 formatted stream. Encode/decode engine 128 then subsamples the YUV 4:4:4 stream to generate a YUV 4:2:0 compressed data stream for transmission at reduced data rate, thus conserving bandwidth. As described in greater detail in conjunction with FIGS. 3 through 7, encode/decode engine 128 may receive compressed data in YUV 4:2:0 format. Encode/decode engine 128 then upsamples the YUV 4:4:0 stream to generate a YUV 4:4:4 stream that may be converted to RGB 4:4:4 for display.

In various embodiments, parallel processing subsystem 112 may be integrated with one or more of the other elements of FIG. 1 to form a single system. For example, parallel processing subsystem 112 may be integrated with CPU 102 and other connection circuitry on a single chip to form a system on chip (SoC).

It will be appreciated that the system shown herein is illustrative and that variations and modifications are possible. The connection topology, including the number and arrangement of bridges, the number of CPUs 102, and the number of parallel processing subsystems 112, may be modified as desired. For example, in some embodiments, system memory 104 could be connected to CPU 102 directly rather than through memory bridge 105, and other devices would communicate with system memory 104 via memory bridge 105 and CPU 102. In other alternative topologies, parallel processing subsystem 112 may be connected to I/O bridge 107 or directly to CPU 102, rather than to memory bridge 105. In still other embodiments, I/O bridge 107 and memory bridge 105 may be integrated into a single chip instead of existing as one or more discrete devices. Lastly, in certain embodiments, one or more components shown in FIG. 1 may not be present. For example, switch 116 could be eliminated, and network adapter 118 and add-in cards 120, 121 would connect directly to I/O bridge 107.

Figure 2:
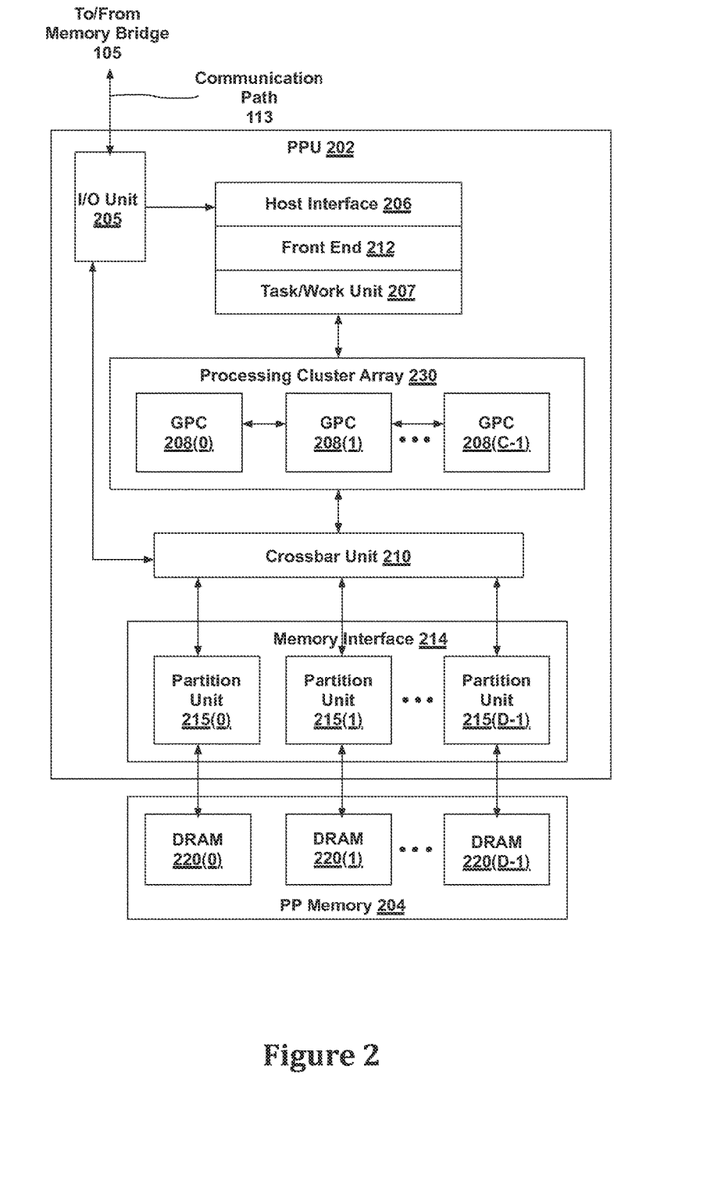
FIG. 2 is a block diagram of a parallel processing unit (PPU) included in the parallel processing subsystem of FIG. 1, according to various embodiments of the present invention.

FIG. 2 is a block diagram of a parallel processing unit (PPU) 202 included in the parallel processing subsystem 112 of FIG. 1, according to various embodiments of the present invention. Although FIG. 2 depicts one PPU 202, as indicated above, parallel processing subsystem 112 may include any number of PPUs 202. As shown, PPU 202 is coupled to a local parallel processing (PP) memory 204. PPU 202 and PP memory 204 may be implemented using one or more integrated circuit devices, such as programmable processors, application specific integrated circuits (ASICs), or memory devices, or in any other technically feasible fashion.

In some embodiments, PPU 202 comprises a graphics processing unit (GPU) that may be configured to implement a graphics rendering pipeline to perform various operations related to generating pixel data based on graphics data supplied by CPU 102 and/or system memory 104. When processing graphics data, PP memory 204 can be used as graphics memory that stores one or more conventional frame buffers and, if needed, one or more other render targets as well. Among other things, PP memory 204 may be used to store and update pixel data and deliver final pixel data or display frames to display device 110 for display. In some embodiments, PPU 202 also may be configured for general-purpose processing and compute operations.

In operation, CPU 102 is the master processor of computer system 100, controlling and coordinating operations of other system components. In particular, CPU 102 issues commands that control the operation of PPU 202. In some embodiments, CPU 102 writes a stream of commands for PPU 202 to a data structure (not explicitly shown in either FIG. 1 or FIG. 2) that may be located in system memory 104, PP memory 204, or another storage location accessible to both CPU 102 and PPU 202. A pointer to the data structure is written to a pushbuffer to initiate processing of the stream of commands in the data structure. The PPU 202 reads command streams from the pushbuffer and then executes commands asynchronously relative to the operation of CPU 102. In embodiments where multiple pushbuffers are generated, execution priorities may be specified for each pushbuffer by an application program via device driver 103 to control scheduling of the different pushbuffers.

As also shown, PPU 202 includes an I/O (input/output) unit 205 that communicates with the rest of computer system 100 via the communication path 113 and memory bridge 105. I/O unit 205 generates packets (or other signals) for transmission on communication path 113 and also receives all incoming packets (or other signals) from communication path 113, directing the incoming packets to appropriate components of PPU 202. For example, commands related to processing tasks may be directed to a host interface 206, while commands related to memory operations (e.g., reading from or writing to PP memory 204) may be directed to a crossbar unit 210. Host interface 206 reads each pushbuffer and transmits the command stream stored in the pushbuffer to a front end 212.

As mentioned above in conjunction with FIG. 1, the connection of PPU 202 to the rest of computer system 100 may be varied. In some embodiments, parallel processing subsystem 112, which includes at least one PPU 202, is implemented as an add-in card that can be inserted into an expansion slot of computer system 100. In other embodiments, PPU 202 can be integrated on a single chip with a bus bridge, such as memory bridge 105 or I/O bridge 107. Again, in still other embodiments, some or all of the elements of PPU 202 may be included along with CPU 102 in a single integrated circuit or system on chip (SoC).

In operation, front end 212 transmits processing tasks received from host interface 206 to a work distribution unit (not shown) within task/work unit 207. The work distribution unit receives pointers to processing tasks that are encoded as task metadata (TMD) and stored in memory. The pointers to TMDs are included in a command stream that is stored as a pushbuffer and received by the front end unit 212 from the host interface 206. Processing tasks that may be encoded as TMDs include indices associated with the data to be processed as well as state parameters and commands that define how the data is to be processed. For example, the state parameters and commands could define the program to be executed on the data. The task/work unit 207 receives tasks from the front end 212 and ensures that GPCs 208 are configured to a valid state before the processing task specified by each one of the TMDs is initiated. A priority may be specified for each TMD that is used to schedule the execution of the processing task. Processing tasks also may be received from the processing cluster array 230. Optionally, the TMD may include a parameter that controls whether the TMD is added to the head or the tail of a list of processing tasks (or to a list of pointers to the processing tasks), thereby providing another level of control over execution priority.

PPU 202 advantageously implements a highly parallel processing architecture based on a processing cluster array 230 that includes a set of C general processing clusters (GPCs) 208, where C≥1. Each GPC 208 is capable of executing a large number (e.g., hundreds or thousands) of threads concurrently, where each thread is an instance of a program. In various applications, different GPCs 208 may be allocated for processing different types of programs or for performing different types of computations. The allocation of GPCs 208 may vary depending on the workload arising for each type of program or computation.

Memory interface 214 includes a set of D of partition units 215, where D≥1. Each partition unit 215 is coupled to one or more dynamic random access memories (DRAMs) 220 residing within PPM memory 204. In one embodiment, the number of partition units 215 equals the number of DRAMs 220, and each partition unit 215 is coupled to a different DRAM 220. In other embodiments, the number of partition units 215 may be different than the number of DRAMs 220. Persons of ordinary skill in the art will appreciate that a DRAM 220 may be replaced with any other technically suitable storage device. In operation, various render targets, such as texture maps and frame buffers, may be stored across DRAMs 220, allowing partition units 215 to write portions of each render target in parallel to efficiently use the available bandwidth of PP memory 204.

A given GPC 208 may process data to be written to any of the DRAMs 220 within PP memory 204. Crossbar unit 210 is configured to route the output of each GPC 208 to the input of any partition unit 215 or to any other GPC 208 for further processing. GPCs 208 communicate with memory interface 214 via crossbar unit 210 to read from or write to various DRAMs 220. In one embodiment, crossbar unit 210 has a connection to I/O unit 205, in addition to a connection to PP memory 204 via memory interface 214, thereby enabling the processing cores within the different GPCs 208 to communicate with system memory 104 or other memory not local to PPU 202. In the embodiment of FIG. 2, crossbar unit 210 is directly connected with I/O unit 205. In various embodiments, crossbar unit 210 may use virtual channels to separate traffic streams between the GPCs 208 and partition units 215.

Again, GPCs 208 can be programmed to execute processing tasks relating to a wide variety of applications, including, without limitation, linear and nonlinear data transforms, filtering of video and/or audio data, modeling operations (e.g., applying laws of physics to determine position, velocity and other attributes of objects), image rendering operations (e.g., tessellation shader, vertex shader, geometry shader, and/or pixel/fragment shader programs), general compute operations, etc. In operation, PPU 202 is configured to transfer data from system memory 104 and/or PP memory 204 to one or more on-chip memory units, process the data, and write result data back to system memory 104 and/or PP memory 204. The result data may then be accessed by other system components, including CPU 102, another PPU 202 within parallel processing subsystem 112, or another parallel processing subsystem 112 within computer system 100.

As noted above, any number of PPUs 202 may be included in a parallel processing subsystem 112. For example, multiple PPUs 202 may be provided on a single add-in card, or multiple add-in cards may be connected to communication path 113, or one or more of PPUs 202 may be integrated into a bridge chip. PPUs 202 in a multi-PPU system may be identical to or different from one another. For example, different PPUs 202 might have different numbers of processing cores and/or different amounts of PP memory 204. In implementations where multiple PPUs 202 are present, those PPUs may be operated in parallel to process data at a higher throughput than is possible with a single PPU 202. Systems incorporating one or more PPUs 202 may be implemented in a variety of configurations and form factors, including, without limitation, desktops, laptops, handheld personal computers or other handheld devices, servers, workstations, game consoles, embedded systems, and the like.

Mixed Threshold Flip-Flop Element

Figure 3:
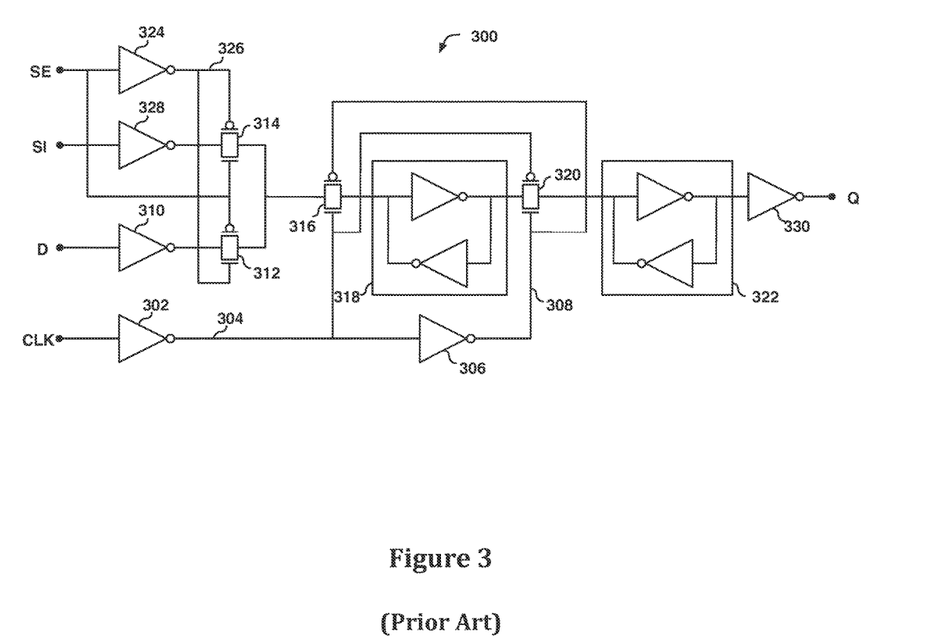
FIG. 3 illustrates a schematic diagram of a conventional flip-flop element.

FIG. 3 illustrates a schematic diagram of a conventional flip-flop element 300. As shown, flip-flop element 300 includes inverters 302, 306, 310, 324, 328, and 330, latches 318 and 322, and transmission gates 312, 314, 316, and 320. Flip-flop element 300 couples the state of data input D to the output Q coincident with the rising edge of the clock input CLK. In some embodiments, flip-flop element 300 may be implemented with FinFETs.

Specifically, inverter 310 inverts data input D and couples to transmission gate 312. When input system enable SE is at a low logic level, inverter 324 causes a high level at node 326. Inverter 310 inverts the logic level of data input D. The low level at input SE and the high level at node 326 cause transmission gate 312 to conduct the inversion of data input D to the input of transmission gate 316. Further, the low level at input SE and the high level at node 326 drive transmission gate 314 to the non-conducting state.

When input CLK is a low logic level, inverter 302 causes a high logic level at node 304, and inverter 306 causes a low logic level at node 308. The high logic level at node 304 and the low level at node 308 cause transmission gate 316 to conduct the inversion of the logic level of data input D to the input of inverting latch 318. Inverting latch 318 stores the (twice inverted) logic level of data input D. The high level at node 304 and the low level at node 308 further drive transmission gate 320 to the non-conducting state to block the logic level of data input D, as stored in inverting latch 318, from the input of inverting latch 322.

When the CLK input transitions to a high level, nodes 304 and 308 change state, with node 304 falling to a low logic level and node 308 rising to a high logic level. The low logic level at node 304 and the high logic level at node 308 cause transmission gate 320 to conduct the output of inverting latch 318 to the input of inverting latch 322. Specifically, inverting latch 322 stores the inversion of the logic level of data input D. Inverter 330 then transmits the logic level of data input D to output Q.

As described herein, a low logic level at input SE and the consequent high logic level at node 326 cause transmission gate 312 to conduct and further drive transmission gate 314 to the non-conducting state. Conversely, when input SE is at a high logic level, inverter 324 drives node 326 to a low logic level. The low logic level at node 326 and the high logic level at input SE cause transmission gate 314 to conduct and further drive transmission gate 312 to the non-conducting state. Transmission gate 312 then blocks data input D from the input of latch 318, and transmission gate 314 conducts scan input SI to the input of latch 318. Flip-flop element 300 then captures scan input SI in the same manner as described above for data input D. In this manner, input SE selects between a data mode and a test mode. Input SE causes data input D to couple to the input of transmission gate 316 during data mode. Further, input SE causes input SI to couple to the input of transmission gate 316 during test mode. Scan input SI allows testability and affords preset capability in flip-flop element 300.

In sum, when input SE is at a low logic level, flip-flop element 300 captures the logic state of data input D and presents the logic state of data input D at output Q on the rising edge of the transition of input CLK from a low logic level to a high logic level. The integrity of the data capture functionality of flip-flop element 300 is thus dependent on the integrity of the clock input CLK.

Figure 4:
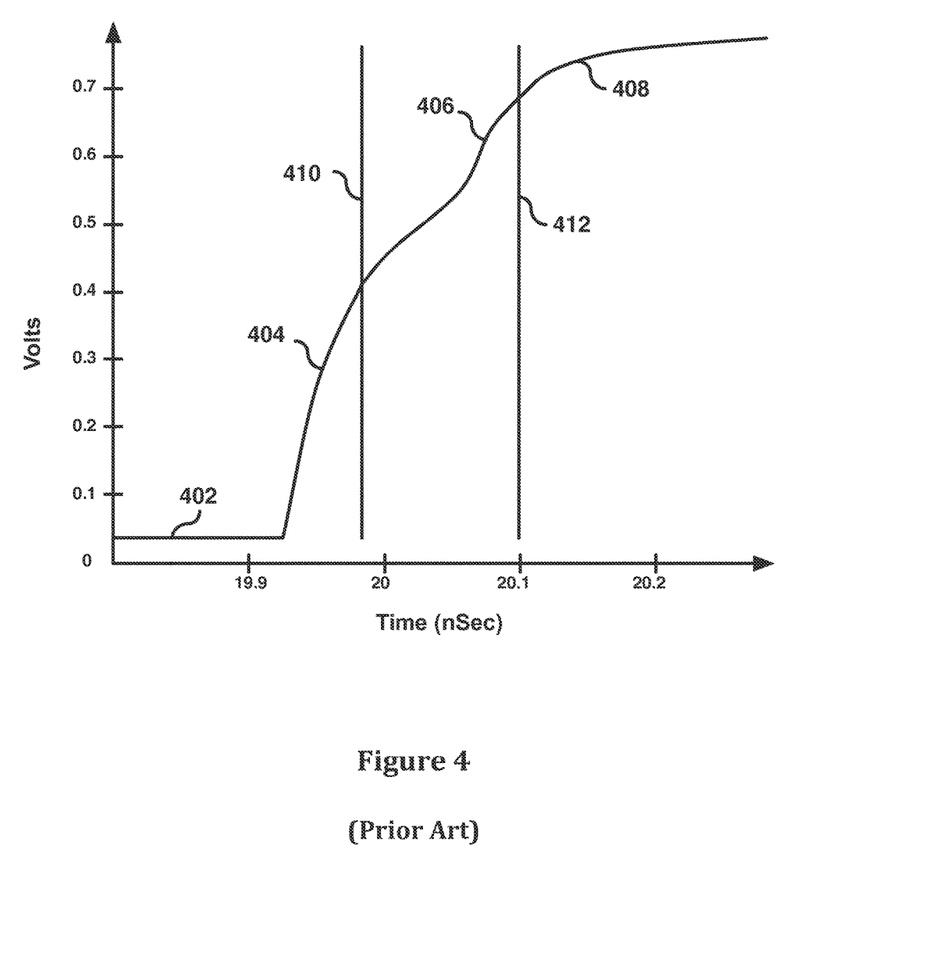
FIG. 4 illustrates a waveform of the clock input of the flip-flop element of FIG. 3.

FIG. 4 illustrates a waveform of the clock input of the flip-flop element of FIG. 3. The waveform illustrated occurs at the gate input of FinFETs (not explicitly shown in FIG. 3) included within inverters 302, 306, 310, 324, 328, and 330, within transmission gates 312, 314, 316, and 320, and within latches 308 and 322. As shown, the waveform has four regions 402, 404, 406, and 408. Region 402 occurs prior to applying a drive voltage to the input of inverter 302. In region 402, the gate terminal voltage is at a relatively low voltage level due to leakage current in the drive circuit and gate-source circuit of inverter 302. When the FinFET receives drive voltage, the gate waveform rises, as shown in region 404. In region 404, the waveform exhibits a quasi-logarithmic rise time. At the time 410, the shape of the waveform is altered, as shown in region 406, due to the effect of the so-called Miller capacitance.

The Miller effect refers to the increase in the input capacitance of an amplifying device due to feedback of load capacitance and stray capacitances within the device, where the increase in capacitance is referred to as the Miller capacitance. The Miller capacitance is more pronounced in a FinFET than in a conventional CMOS FET due to the three-dimensional geometry of the FinFET. The FinFET is a vertical structure in which the gate terminal wraps around the drain-to-source channel. The geometric structure of the FinFET affords advantages for low-power and high-speed operation. However, the structure of the FinFET increases the virtual input capacitance caused by the Miller effect, leading to an increase in the rise time of the gate waveform, thereby causing a delay and uncertainty in the response of the output.

The switching threshold of the FinFET occurs in region 406, and the switching action combined with the large Miller capacitance cause a perturbation in the waveform. As shown in region 406, the distortion causes first an initial increase in rise time and then a reduction in rise time until time 412. In the interval between time 410 and time 412, the drive voltage charges the Miller capacitance. After time 412, the drive voltage continues to drive the gate terminal, and the waveform resumes a quasi-logarithmic rise time, as shown at region 408. For the purposes of clarity, only a rising-edge waveform is shown in FIG. 4. However, in some embodiments, a corresponding falling-edge waveform may occur at the gate input of the FinFET during a high-to-low voltage transition.

The Miller effect causes delay, as evidenced by the reduced waveform slope/increased rise time. In addition, if the reduced slope region occurs at or around the input threshold voltage, there is uncertainty as to the time when the input voltage crosses the threshold level, and, correspondingly, when the output voltage changes. As a result, the time at which the transition of the output (drain-to-source voltage) of the FinFET is likewise uncertain. The uncertainty in the transition of the output results in additional delay. When the FinFET is located in a critical timing path, such as the clock input CLK, the additional delay causes an increase in hold time, which limits the speed of processing of the flip-flop element 300.

A critical timing path in a flip-flop element is the clock circuit, as exemplified by elements 302 and 306 associated with input CLK as illustrated above in conjunction with FIG. 3. Hold time is a critical timing parameter in the flip-flop element. Hold time is the minimum time that a data input D signal is to be held steady after an active edge of the clock signal, such as the rising edge of input CLK of FIG. 3, so that the state of the data is reliably sampled. Hold time is determined by the difference between the delay of the clock input CLK path and the delay of the data input D path. As the delay through the clock input CLK path increases, the hold time likewise increases, causing slower processing of data through the flip-flop element. The slower processing may necessitate corrective action such as increased timing margins and inclusion of delay buffers that further slow system processing speed.

The threshold voltage of a FinFET is typically specified to have one of various levels. Specifically, FinFETs are available in low voltage threshold (LVT), standard voltage threshold (SVT), and high voltage threshold (HVT) types. The thickness of the oxide of the gate terminal determines the level of the threshold voltage, with a thinner oxide providing a lower threshold. A trade-off occurs in the leakage current, which increases with decreasing oxide thickness. Because of the lower leakage current of HVT FinFETs, HVT FinFETs are advantageous in low power applications. However, the magnitude of the Miller capacitance is most pronounced in HVT FinFETs. The effect of this Miller capacitance is further aggravated with increased loading (larger fan-out) and when operating at lower supply voltage levels. However, FinFETs are advantageous for use with larger fan-out and at lower supply voltage levels. A solution to the problems associated with increased Miller capacitance, as described herein, is now presented below in conjunction with FIGS. 5 and 6.

Figure 5:
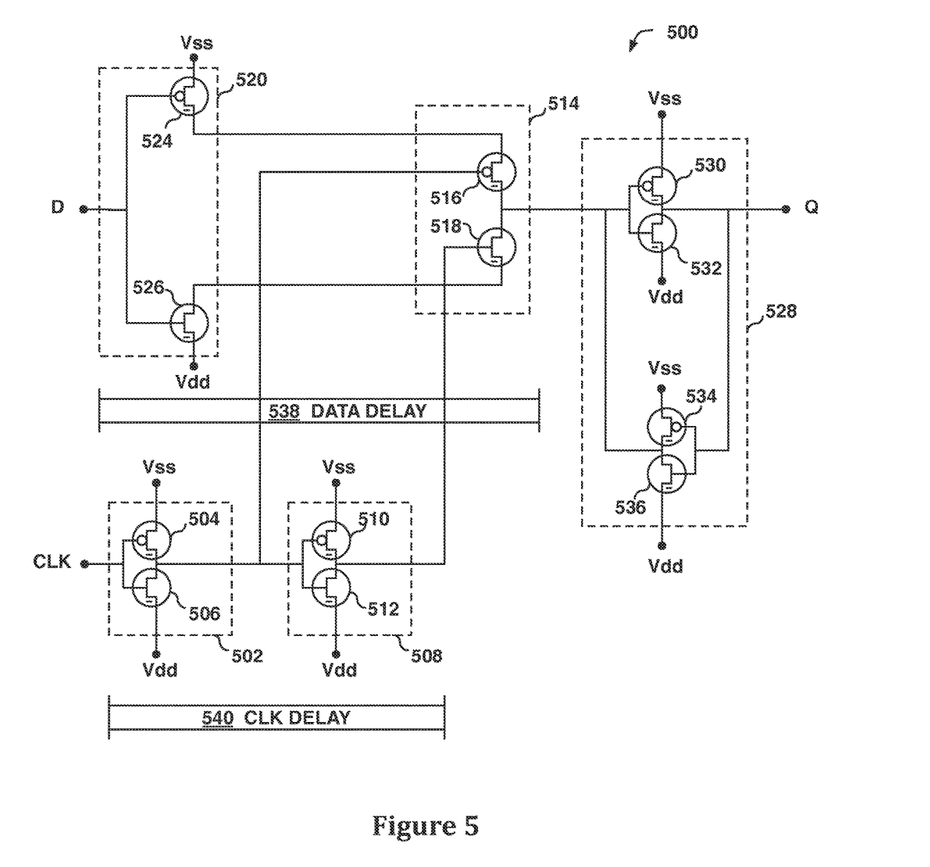
FIG. 5 illustrates a schematic diagram of a flip-flop element, according to various embodiments of the present invention.

FIG. 5 illustrates a schematic diagram of a flip-flop element 500, according to various embodiments of the present invention. As shown, flip-flop element 500 includes inverter 502, which includes SVT FinFET 504 and SVT FinFET 506, and inverter 508, which includes SVT FinFET 510 and SVT FinFET 512. Flip-flop element 500 further includes transmission gate 514, which includes HVT FinFET 516 and HVT FinFET 518, and inverter 520, which includes HVT FinFET 524 and HVT FinFET 526. Finally, flip-flop element 500 includes latch 528, which includes HVT FinFET 530, HVT FinFET 532, HVT FinFET 534, and HVT FinFET 536.

In operation, a low logic level at the clock input CLK causes SVT FinFET 504 to conduct while SVT FinFET 506 is non-conducting, producing a high logic level at the gate terminals of SVT FinFET 510, SVT FinFET 512, and HVT FinFET 516. Because of the high logic level at the input of inverter 508, SVT FinFET 510 is non-conducting and SVT FinFET 512 produces a low logic level at the gate terminal of HVT FinFET 518. Consequently, HVT FinFET 516 and HVT FinFET 518 are both non-conducting, and transmission gate 514 is, therefore, in the "off" state.

At the rising edge of clock input CLK, the output of inverter 502 transitions from a high to low logic level, causing a low logic level at the gate terminal of HVT FinFET 516. The low logic level at the gate terminal of HVT FinFET 516 causes HVT FinFET 516 to conduct. The output of inverter 508 transitions from a low to high level, causing a high logic level at the gate terminal of HVT FinFET 518. The high logic level at the gate terminal of HVT FinFET 518 causes HVT FinFET 518 to conduct. Consequently, HVT FinFET 516 and HVT FinFET 518 are both conducting, and transmission gate 514 is, thus, in the "on" state.

When data input D is high, HVT FinFET 526 is conducting and HVT FinFET 524 is non-conducting. When data input D is low, HVT FinFET 526 is non-conducting and HVT FinFET 524 is conducting. As a result, when transmission gate 514 is conducting, the inversion of the logic state of input data input D is transmitted to latch 528 via HVT FinFET 516 and HVT FinFET 518.

FinFETs 524, 526, 516, 518, 530, 532, 534, and 536 are HVT FinFETs and provide the advantages of lower leakage current, improved power efficiency, and higher physical density associated with HVT FinFET technology, relative to planar FETs. The gate waveforms of HVT FinFETs 524, 526, 516, 518, 530, 532, 534, and 536 are as illustrated in FIG. 4. FinFETs 504, 506, 510, and 512 are SVT FinFETs and provide the advantage of lower Miller capacitance associated with SVT FinFET technology. The gate waveforms of FinFETs 504, 506, 510, and 512 are as illustrated in FIG. 6.

Implementing the FinFETs 504, 506, 510, and 512 that process the clock input CLK with SVT FinFETs reduces the level of distortion in the clock circuit relative to an HVT FinFET implementation. The FinFETs 524, 526, 516, 518, 530, 532, 534, and 536 in the data input path, by contrast, are implemented with HVT FETs. Implementing the flip-flop element 500 with mixed thresholds, that is SVT FinFETs for the clock path elements and HVT FinFETs for the data path elements, reduces clock delay and obviates the need for other corrective approaches, such as increasing timing margins or adding hold buffers that may otherwise be necessary.

It will be appreciated that the system shown herein is illustrative and that variations and modifications are possible. Although the embodiments herein describe a flip-flop element that implements HVT FinFETs in the data input path and SVT FinFETs in the clock input path, other embodiments that likewise implement transistors with relatively low Miller capacitance in the clock input path are contemplated within the scope of the present invention. In one example, and without limitation, the data input path could be implemented with HVT FinFETs, while the clock input path could be implemented with LVT FinFETs. In another example, and without limitation, the data input path could be implemented with SVT FinFETs, while the clock input path could be implemented with LVT FinFETs.

Figure 6:
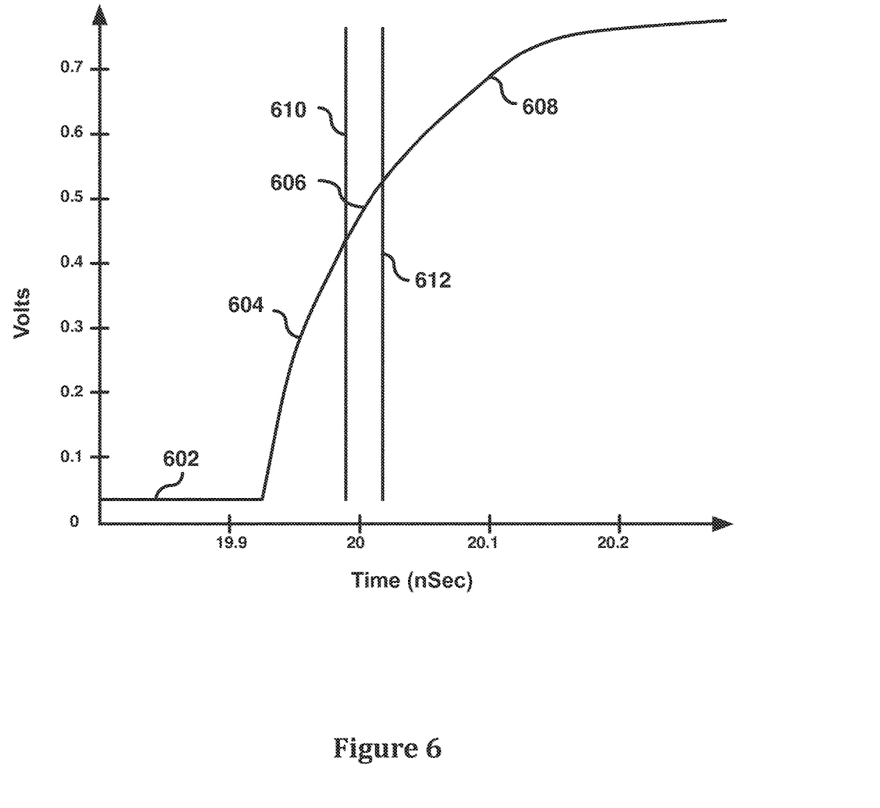
FIG. 6 illustrates a waveform of the clock input of the flip-flop element of FIG. 5, according to various embodiments of the present invention.

FIG. 6 illustrates a waveform of the clock input of the flip-flop element 500 of FIG. 5, according to various embodiments of the present invention. As shown, the waveform has four regions 602, 604, 606, and 608. Region 602 occurs prior to applying drive voltage to the gate terminal. In region 602, the gate terminal of the SVT FinFET, such as SVT FinFET 506, is at a relatively low voltage level due to leakage current in the drive circuit and gate-source circuit. When the SVT FinFET 506 receives drive voltage, the gate waveform rises, as shown in region 604, and exhibits a quasi-logarithmic rise time. In region 606, the rise time of the SVT FinFET 506 shows less distortion from the effect of the Miller capacitance, relative to the distortion associated with the HVT FinFET as illustrated in FIG. 4. Accordingly, the switching threshold, which occurs between time 610 and time 612, is more predictable than that which occurs in the HVT FinFET as shown above in conjunction with FIG. 4. The reduced distortion of the gate waveform of SVT FinFET 506 leads to faster rise time, which leads, in turn, to a reduced hold time. Thus, the flip-flop element 500 operates with reduced hold time and more predictable clock transitions, leading to increased speed of processing. After time 612, the drive voltage continues to drive the gate terminal, and the waveform continues to exhibit a quasi-logarithmic rise time, as shown at region 608. For the purposes of clarity, only a rising-edge waveform is shown in FIG. 6. However, in some embodiments, a corresponding falling-edge waveform may occur at the gate input of the FinFET during a high-to-low voltage transition In sum, a flip-flop element is configured to include FinFET technology transistors with a mix of threshold voltage levels. The data input path includes transistors implemented with high voltage threshold (HVT) FinFETs. The clock input path includes transistors implemented with standard voltage threshold (SVT) FinFETs. By including FinFET transistors with SVT thresholds in the clock signal path, the Miller capacitance of the clock signal path is reduced relative to HVT transistors, leading to lower rise time and correspondingly lower hold time. By including HVT threshold devices in the data input path, the flip-flop element attains high speed and low power operation. By including SVT threshold devices in the clock signal path, the flip-flop element achieves faster switching times in the clock signal path.

At least one advantage of the techniques described herein is that placing SVT FinFETs in the clock signal path and HVT FinFETs in the data signal path allows the flip-flop element to achieve the advantages of HVT FinFET's while mitigating the delay effects and hold time penalty that would otherwise be incurred if HVT FinFETs were deployed in the clock signal path. As a result, hold time is reduced, thereby increasing performance, while low voltage, low power operation is maintained.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable processors or gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A flip-flop circuit element configured to perform a data capture operation, the flip-flop circuit element comprising:
    a data signal path for transmitting a first data signal that has a first logic state from a data input of a first logic element to a data output of the first logic element, the first logic element including:
        a transmission gate that generates a second data signal based on the first data signal, and
        a latch element that:
            receives the second data signal,
            stores a second logic state associated with the second data signal, and
            changes logic state of the second data signal at a first transition time after the second data signal transitions through a first threshold level associated with the data signal path,
        wherein a majority of transistors included in the first logic element comprise high voltage transistors; and a clock signal path coupling a clock input of the flip-flop circuit element to the data signal path and including a second logic element that:
  receives a first clock signal, and
  changes logic state at a second transition time after the first clock signal transitions through a second threshold level associated with the clock signal path,
  wherein the clock signal path includes one or more low voltage transistors, and
  wherein the second transition time is less than the first transition time.

2. The circuit element of claim 1, wherein the second threshold level is lower than the first threshold level.

3. The circuit element of claim 1, wherein the first logic element further includes an inverter configured to receive the first data signal, and invert the first data signal to generate a third data signal, wherein the transmission gate generates the second data signal based on the first data signal by receiving the third data signal, and generating the second data signal based on the third data signal.

4. The circuit element of claim 1, wherein the second logic element includes:
  a first inverter configured to:
    receive the first clock signal,
    invert the first clock signal to generate a second clock signal, and
    transmit the second clock signal to a first input of a transmission gate associated with the first logic element; and
  a second inverter configured to:
    receive the second clock signal,
    invert the second clock signal to generate a third clock signal, and
    transmit the third clock signal to a second input of the transmission gate.

5. The circuit element of claim 1, wherein the first logic element includes a first plurality of field effect transistors, and the second logic element includes a second plurality of field effect transistors.

6. The circuit element of claim 5, wherein at least one field effect transistor included in the first plurality of field effect transistors is configured to change logic state after the first data signal transitions through the first threshold level.

7. The circuit element of claim 5, wherein at least one field effect transistor included in the second plurality of field effect transistors is configured to change logic state after the first clock signal transitions through the second threshold level.

8. The circuit element of claim 5, wherein at least one of the first plurality of field effect transistors and the second plurality of field effect transistors includes non-planar field effect transistors.

9. The circuit element of claim 5, wherein at least one of the first plurality of field effect transistors and the second plurality of field effect transistors includes multi-gate field effect transistors.

10. The circuit element of claim 5, wherein the first plurality of field effect transistors includes high voltage threshold (HVT) FinFETs, and the second plurality of field effect transistors includes standard voltage threshold (SVT) FinFETs.

11. A subsystem, comprising:
  a first circuit element configured to generate a first data signal;
  a second circuit element configured to generate a first clock signal; and
  a flip-flop circuit element configured to perform a data capture operation, the flip-flop circuit element comprising:
    a data signal path for transmitting a first data signal that has a first logic state from a data input of a first logic element to a data output of the first logic element, the first logic element including:
      a transmission gate that generates a second data signal based on the first data signal, and
      a latch element that:
        receives the second data signal,
        stores a second logic state associated with the second data signal, and
        changes logic state of the second data signal at a first transition time after the second data signal transitions through a first threshold level associated with the data signal path,
      wherein a majority of transistors included in the first logic element comprise high voltage transistors, and
    a clock signal path coupling a clock input of the flip-flop circuit element to the data signal path and including a second logic element that:
      receives first clock signal, and
      changes logic state at a second transition time after the first clock signal transitions through a second threshold level associated with the clock signal path,
      wherein the clock signal path includes one or more low voltage transistors, and
      wherein the second transition time is less than the first transition time.

12. The subsystem of claim 11, wherein the second threshold level is lower than the first threshold level.

13. The subsystem of claim 11, wherein the first logic element further includes an inverter configured to receive the first data signal, and invert the first data signal to generate a third data signal, wherein the transmission gate generates the second data signal based on the first data signal by receiving the third data signal, and generating the second data signal based on the third data signal.

14. The subsystem of claim 11, wherein the second logic element includes:
  a first inverter configured to:
    receive the first clock signal,
    invert the first clock signal to generate a second clock signal, and
    transmit the second clock signal to a first input of a transmission gate associated with the first logic element; and
  a second inverter configured to:
    receive the second clock signal,
    invert the second clock signal to generate a third clock signal, and
    transmit the third clock signal to a second input of the transmission gate.

15. The subsystem of claim 11, wherein the first logic element includes a first plurality of field effect transistors, and the second logic element includes a second plurality of field effect transistors.

16. The subsystem of claim 15, wherein at least one field effect transistor included in the first plurality of field effect transistors is configured to change logic state after the first data signal transitions through the first threshold level.

17. The subsystem of claim 15, at least one field effect transistor included in the second plurality of field effect transistors is configured to change logic state after the first clock signal transitions through the second threshold level.

18. The subsystem of claim 15, wherein at least one of the first plurality of field effect transistors and the second plurality of field effect transistors includes non-planar field effect transistors.

19. The subsystem of claim 15, wherein at least one of the first plurality of field effect transistors and the second plurality of field effect transistors includes multi-gate field effect transistors.

20. The subsystem of claim 15, wherein the first plurality of field effect transistors includes high voltage threshold (HVT) FinFETs, and the second plurality of field effect transistors includes standard voltage threshold (SVT) FinFETs.

21. A flip-flop circuit element configured to perform a data capture operation, the flip-flop circuit element comprising:
  a data signal path for transmitting a first data signal that has a first logic state from a data input of a first logic element to a data output of the first logic element, the first logic element including a first plurality of field effect transistors that form:
    a transmission gate that generates a second data signal based on the first data signal, and
    a latch element that:
      receives the second data signal, and
      stores a second logic state associated with the second data signal,
  wherein, when the first plurality of field effect transistors are driven by a data signal, each of the first plurality of field effect transistors changes state after a first rise time, and wherein a majority of transistors included in the first logic element comprise high voltage transistors; and
  a clock signal path coupling a clock input of the flip-flop circuit element to the data signal path and including a second plurality of field effect transistors, wherein, when the second plurality of field effect transistors are driven by a clock signal, each of the second plurality of field effect transistors changes state after a second rise time, and wherein the clock signal path includes one or more low voltage transistors,
  wherein the second rise time is less than the first rise time.

22. The circuit element of claim 21, wherein, when the first plurality of field effect transistors are driven by the data signal, a first gate voltage associated with the first plurality of field effect transistors rises to a first transition voltage at the first rise time.

23. The circuit element of claim 21, wherein, when the second plurality of field effect transistors are driven by the clock signal, a second gate voltage associated with the second plurality of field effect transistors rises to a second transition voltage in the second rise time.

24. The circuit element of claim 21, wherein each of the first plurality of field effect transistors comprises a high voltage threshold (HVT) fin field-effect transistor (FinFET), and wherein each of the second plurality of field effect transistors comprises a standard voltage threshold (SVT) FinFET.

25. The circuit element of claim 21, wherein the data path is associated with a first Miller capacitance, and the clock path is associated with a second Miller capacitance, and wherein the first Miller capacitance is greater than the second Miller capacitance.

* * * * *